US009648425B2

(12) United States Patent
Zinn et al.

(10) Patent No.: US 9,648,425 B2
(45) Date of Patent: May 9, 2017

(54) MULTI-LAYER COMPOSITE BACKPLATE FOR MICROMECHANICAL MICROPHONE

(71) Applicant: Robert Bosch GmbH, Stuttgart (DE)

(72) Inventors: John W. Zinn, Canonsburg, PA (US); Brett Matthew Diamond, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/894,390

(22) PCT Filed: May 28, 2014

(86) PCT No.: PCT/US2014/039793
§ 371 (c)(1),
(2) Date: Nov. 27, 2015

(87) PCT Pub. No.: WO2014/193954
PCT Pub. Date: Dec. 4, 2014

(65) Prior Publication Data
US 2016/0127837 A1    May 5, 2016

Related U.S. Application Data

(60) Provisional application No. 61/827,982, filed on May 28, 2013.

(51) Int. Cl.
*H04R 19/00* (2006.01)
*B81B 3/00* (2006.01)

(52) U.S. Cl.
CPC ........... *H04R 19/005* (2013.01); *B81B 3/007* (2013.01); *B81B 2201/0257* (2013.01); *H04R 2201/003* (2013.01)

(58) Field of Classification Search
CPC .............................. H04R 19/005; H04R 19/04
See application file for complete search history.

(56) References Cited

U.S. PATENT DOCUMENTS

| | | | |
|---|---|---|---|
| 2,868,894 A * | 1/1959 | Schultz | H04M 1/03 361/283.4 |
| 8,590,136 B2 | 11/2013 | Yang et al. | |
| 2007/0264749 A1* | 11/2007 | Birkmeyer | B81C 1/00111 438/106 |
| 2009/0122651 A1 | 5/2009 | Kupnik et al. | |
| 2010/0119088 A1* | 5/2010 | Sheplak | H04R 19/04 381/176 |

(Continued)

FOREIGN PATENT DOCUMENTS

| | | | | |
|---|---|---|---|---|
| CN | 202261791 U | 5/2012 | | |
| EP | 2202559 A2 * | 6/2010 | ........... | B81C 1/0023 |

(Continued)

OTHER PUBLICATIONS

International Search Report and Written Opinion for Application No. PCT/US2014/039793 dated Jun. 2, 2014, 9 pages.

*Primary Examiner* — Calvin Choi
*Assistant Examiner* — S. M. S Imtiaz
(74) *Attorney, Agent, or Firm* — Michael Best & Friedrich LLP

(57) ABSTRACT

A MEMS device. The device includes a membrane, and a reinforced backplate having a plurality of openings. The reinforced backplate include a first layer, and a second layer coupled to the first layer.

22 Claims, 10 Drawing Sheets

(56) References Cited

U.S. PATENT DOCUMENTS

| | | | |
|---|---|---|---|
| 2010/0164025 A1 | 7/2010 | Yang | |
| 2012/0189143 A1* | 7/2012 | Buhmann | H04R 19/005 |
| | | | 381/174 |
| 2012/0225259 A1 | 9/2012 | Mortensen et al. | |
| 2012/0319174 A1 | 12/2012 | Wang | |
| 2013/0285173 A1* | 10/2013 | Reimann | H04R 19/005 |
| | | | 257/416 |
| 2013/0343580 A1 | 12/2013 | Lautenschlager et al. | |
| 2014/0084396 A1 | 3/2014 | Jenkins et al. | |

FOREIGN PATENT DOCUMENTS

| | | | | |
|---|---|---|---|---|
| EP | 2536168 A2 | 12/2012 | | |
| GB | 2467776 A | * | 8/2010 | ......... B81C 1/00246 |
| WO | 2006123299 A2 | 11/2006 | | |

* cited by examiner

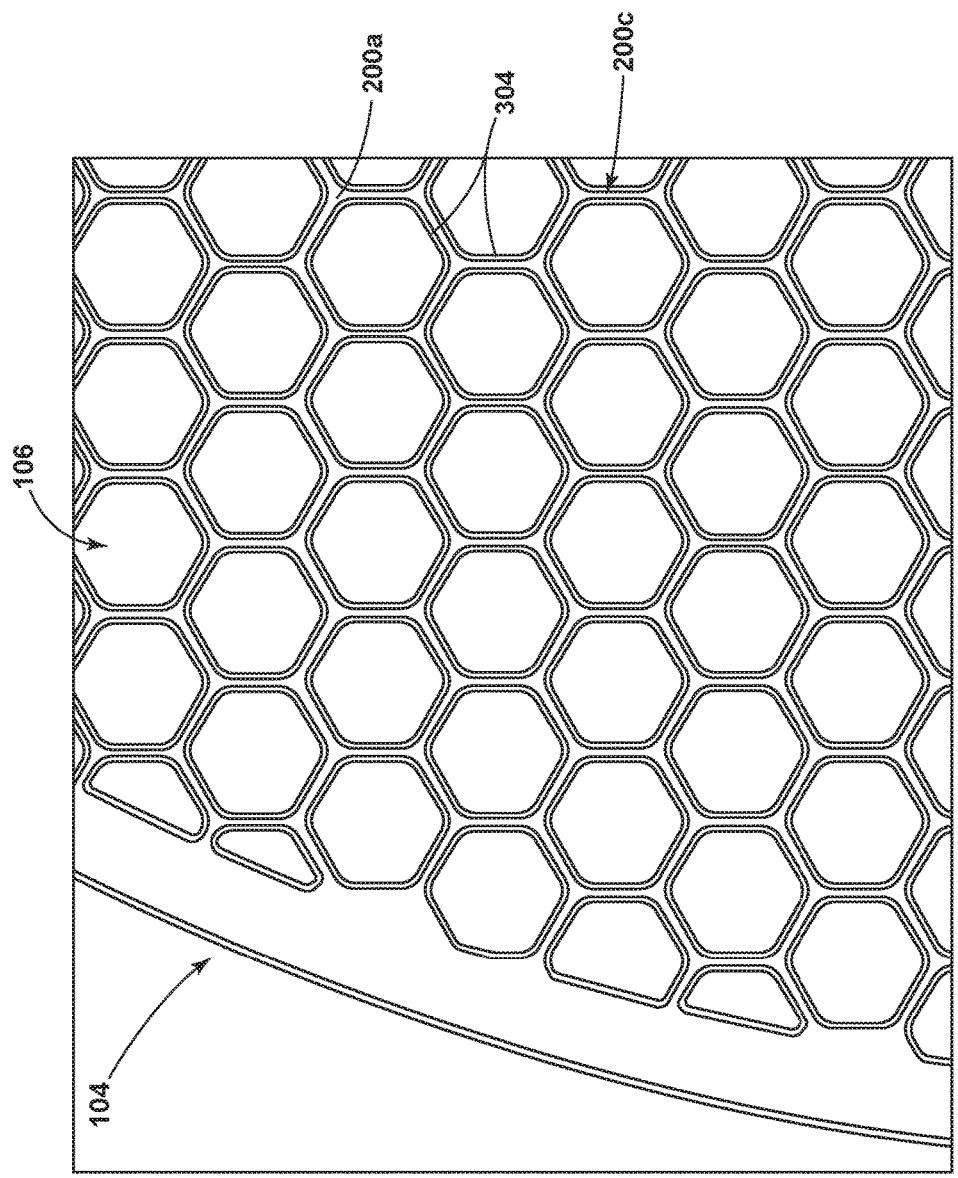

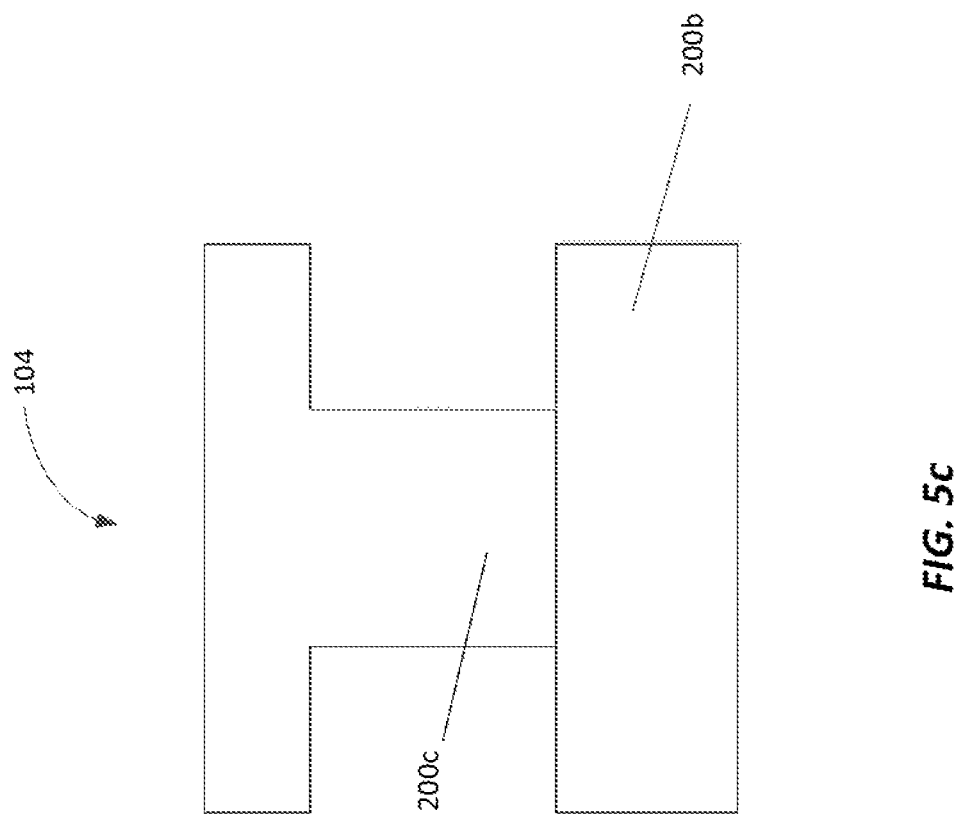

ical systems
MULTI-LAYER COMPOSITE BACKPLATE FOR MICROMECHANICAL MICROPHONE

RELATED APPLICATION

The present patent application claims the benefit of prior filed U.S. Provisional Patent Application No. 61/827,982, filed on May 28, 2013, the entire content of which is hereby incorporated by reference.

BACKGROUND

The present invention relates to micromechanical systems ("MEMS"), such as, for example, MEMS microphone systems.

SUMMARY

In one embodiment, the invention provides a MEMS microphone system. The system includes a membrane and a perforated counter electrode opposite the membrane, also referred to as a backplate regardless of position relative to the membrane. The backplate includes multiple thin layers of varying materials which are stacked to produce a rigid, strong, and flat backplate. Thick MEMS layers are prone to stress gradients which cause curvature, but by alternating thin layers of different materials it is possible to minimize backplate curvature. Additionally, through a composite layered backplate, it is possible to combine tensile material layers with compressive material layers to adjust the amount of net tension in the backplate affecting the strength and rigidity of the backplate. Thin layers can also be more easily patterned to tighter tolerances. In particular, one embodiment of the invention related to CMOS MEMS provides a backplate including an upper metal layer and a lower metal layer with similar embodiments related to traditional MEMS using other material layers. An interconnect layer connects the two metal layers. The interconnect layer can have a smaller width than the metal layers and can be constructed from a different metal (e.g., tungsten). The interconnect layer can be constructed of multiple materials including using a sacrificial material (e.g. silicon dioxide) encapsulated by another material or combination of materials. In one embodiment, an upper layer is used to encapsulate and protect an unetched but otherwise sacrificial interconnect layer. The upper and lower layers may each also be constructed with different widths, different thicknesses, and different opening sizes with respect to each other. A person skilled in the art would know that the structures described herein are made by known methods such as depositing layers and patterning them.

In another embodiment, the invention provides a MEMS device. The device includes a membrane, and a reinforced backplate having a plurality of openings. The reinforced backplate include a first layer, and a second layer coupled to the first layer.

Other aspects of the invention will become apparent by consideration of the detailed description and accompanying drawings.

BRIEF DESCRIPTION OF THE DRAWINGS

FIG. 4d is a top, plan view of a composite backplate including an interconnect layer composed of individual continuous walls surrounding each backplate opening.

FIGS. 5a-c are side, cross-sectional views of alternative configurations of a composite backplate.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
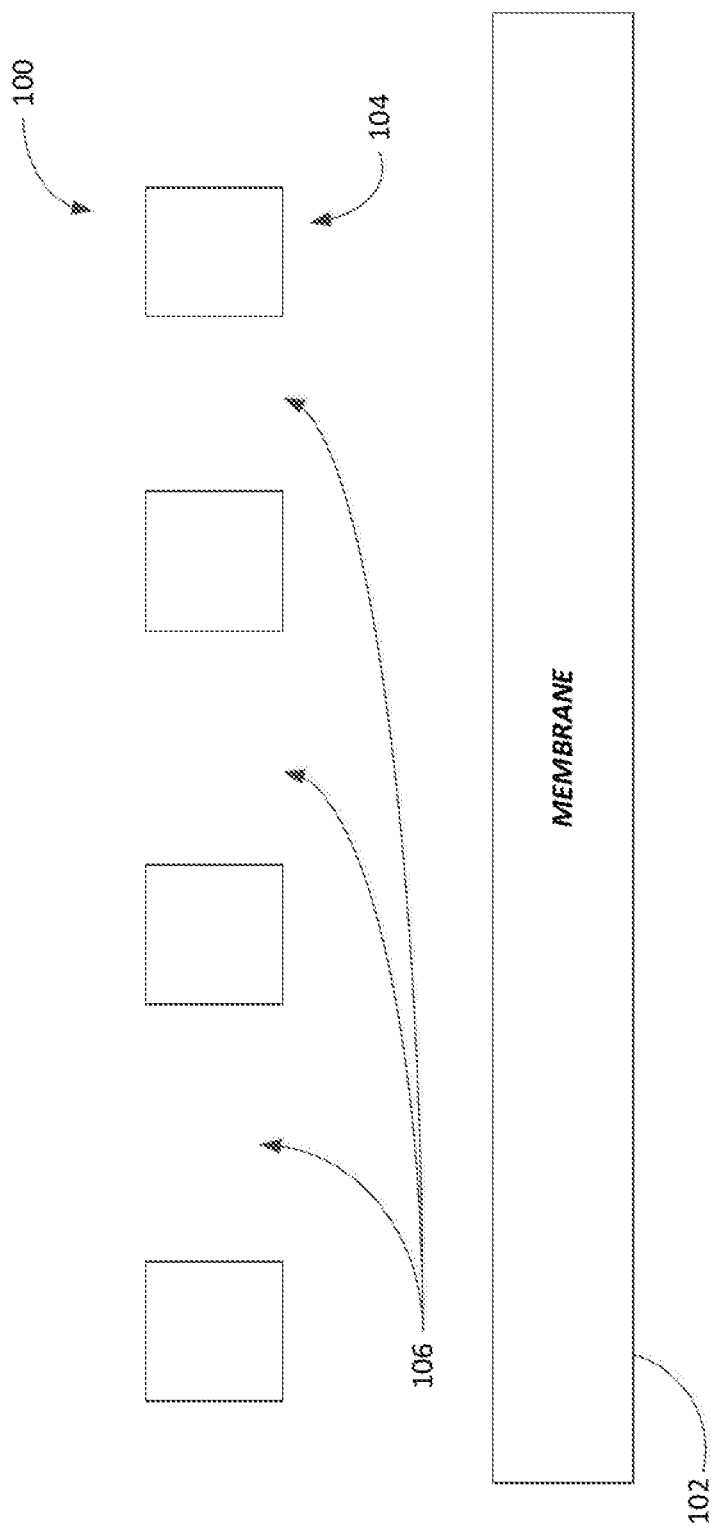
FIG. 1 is a schematic cross-sectional view of a portion of a MEMS microphone system.

FIG. 1 is a side, cross-sectional view of a portion of a MEMS microphone system 100. As described in further detail below, the system includes a membrane 102 that moves in response to acoustic pressures and a counter electrode opposite the membrane (referred to as a backplate) 104. An electrical circuit detects movement of the membrane 102 relative to the backplate 104 (e.g., due to varying capacitance) and generates an electrical signal indicative of the acoustic pressure (i.e., sound). CMOS and/or ASIC components (e.g., integrated with the system 100 or external to the system 100) process the electrical signal. As illustrated in FIG. 1, the backplate 104 can include holes or vents 106 that allow air to pass between the membrane 102 and the backplate 104. For optimal performance and durability, the backplate needs a balance between size and strength. For example, a thick backplate provides robust strength but reduces the acoustic noise performance of the system 100. Similarly, a thin or highly perforated backplate may not provide adequate strength and may not provide adequate particle filtration. By using a composite construction of thin material layers, as show in FIG. 2, it is also possible to pattern thinner web sections between vent holes allowing for the placement of more and potentially smaller vent holes 106 in the backplate. Furthermore, the design of the backplate, including both the thickness of the backplate and the size and number of vent hole openings 106, impacts the microphone capacitance and sensitivity and impacts the acoustic signal-to-noise ratio of the system. Therefore, the design of the backplate impacts the performance of the system 100.

Figure 2:
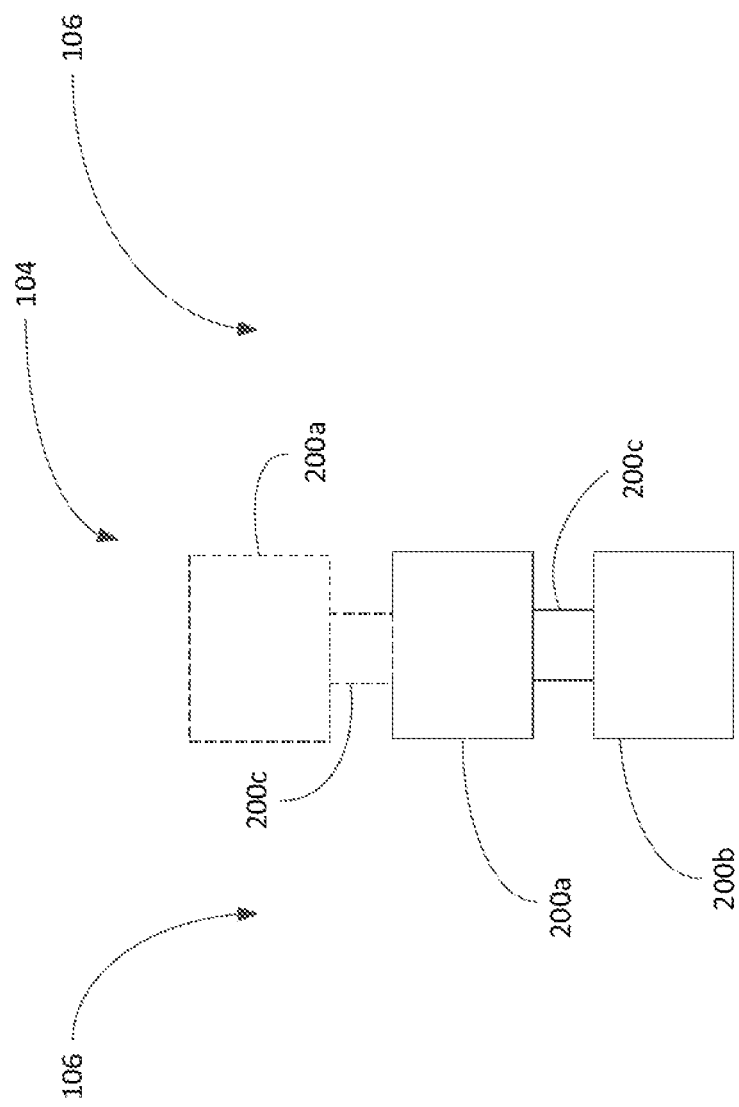
FIG. 2 is side, cross-sectional view of a composite backplate.

FIG. 2 is a cross-sectional view of the backplate 104 in more detail. As illustrated in FIG. 2, for one embodiment of this invention, the backplate 104 includes an upper metal layer 200a and a lower metal layer 200b. An interconnect layer 200c connects the upper layer 200a and the lower layer 200b. Each of the upper and lower metal layers can include a composite stack of different metals. For example, in one embodiment related to CMOS. MEMS, at least one of the upper and lower layers 200a and 200b are composed of a stack of the following layers: titanium nitride, titanium, aluminum copper, titanium, and titanium nitride. Also, in some embodiments, at least one of the layers 200a, 200b, and 200c is formed out of an insulator rather than metal. Accordingly, in general, the composite backplate 104 can include conductive or insulating upper and lower layers 200a and 200b and a conductive or insulating interconnect layer 200c.

The vertical interconnect layer 200c can be constructed of a different material than the upper and lower layers 200a and 200b, such as a standard CMOS via material layer such as tungsten. In some embodiments, as illustrated in FIG. 2, the interconnect layer 200c has a smaller width than the upper layer 200a and/or the lower layer 200b. Also, in some embodiments, each layer has a different width. Furthermore, in an additional embodiment, the interconnect material 200c is removed so that the upper layer 200a connects directly to the lower layer 200b.

Figure 3A:
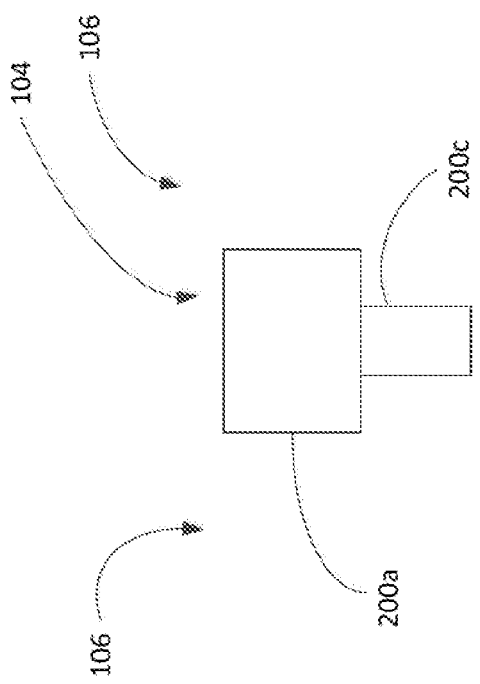
FIGS. 3a and 3b are side, cross-sectional views of alternative constructions of a composite backplate.
Figure 3B:
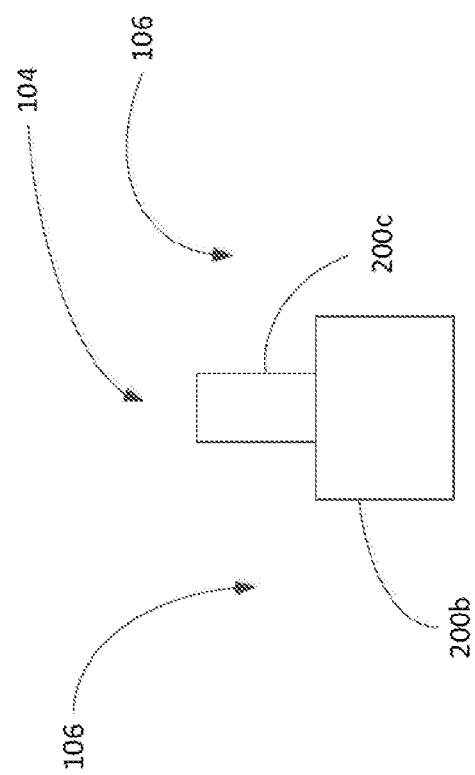

In addition, as illustrated in FIG. 2, additional layers can be added to the backplate 104. For example, as illustrated in phantom, another interconnect layer 200c and another upper metal layer 200a can be added to the backplate. Similarly, as illustrated in FIGS. 3a and 3b, in some embodiments, only one of the upper and lower layers 200a and 200b are used in the backplate 104 where no metal (or insulator) layer is present above or below the interconnect layer 200c.

Figure 4A:
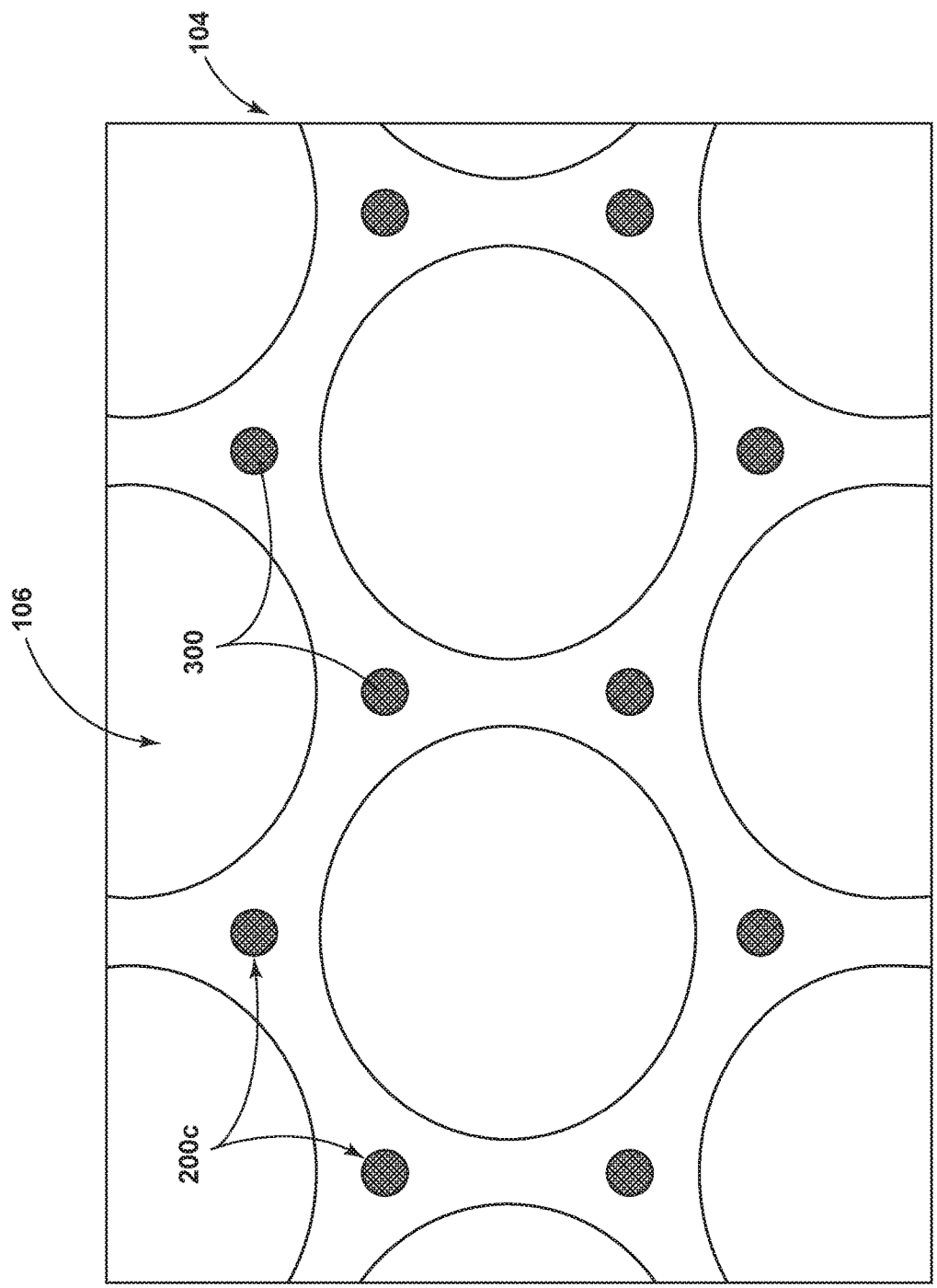
FIGS. 4a and 4b are top, plan views of a composite backplate including an interconnect layer composed of discrete posts.
Figure 4B:
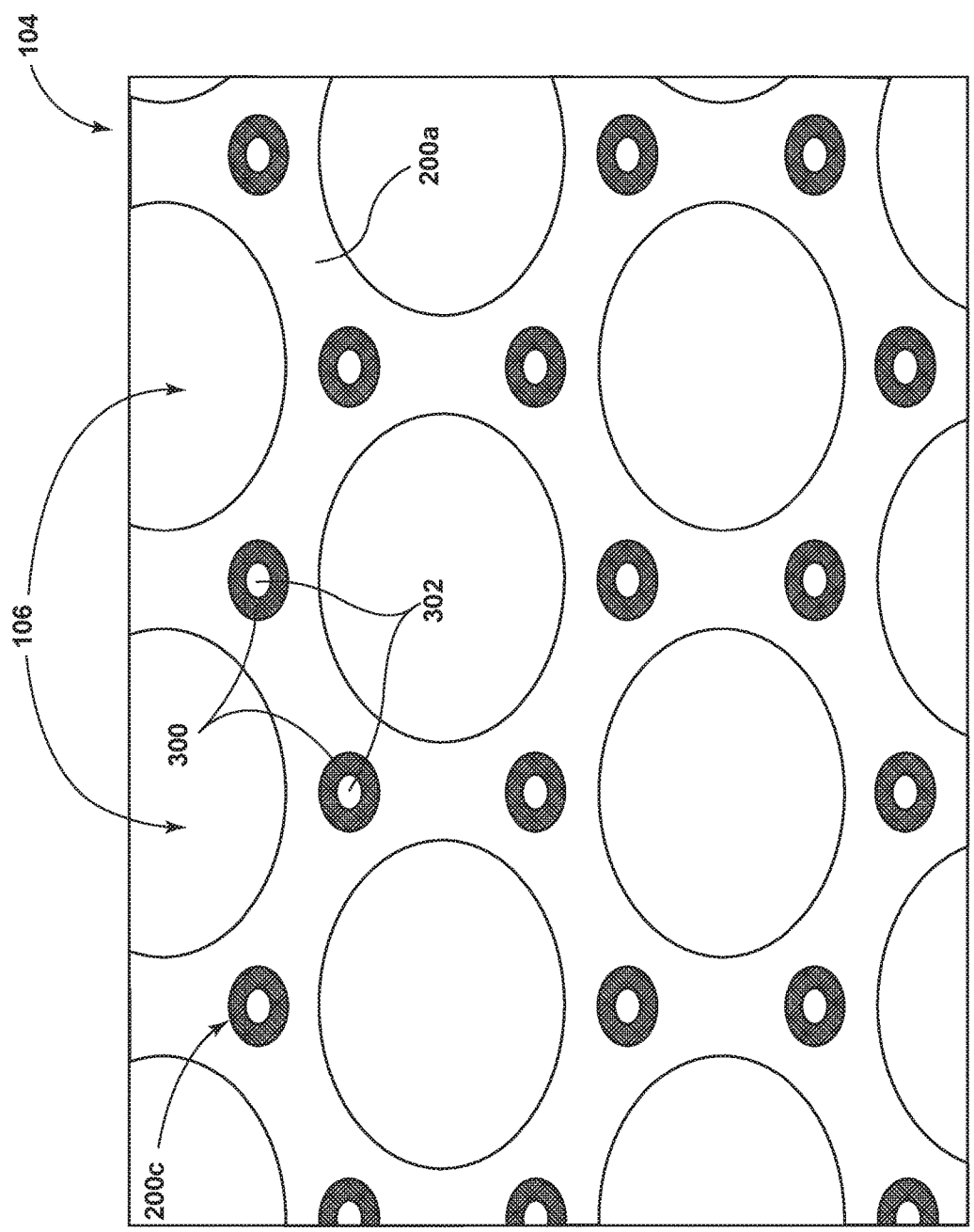

The interconnect layer 200c can be provided as discrete connections (e.g. as intermittent linear segments or circular posts) or as a continuous wall. For example, FIG. 4a is a top, plan view of the backplate 104 where the interconnect layer 200c is formed to create posts 300 positioned between the holes 106. As illustrated in FIG. 4a, the posts 300 can be solid. In other embodiments, as illustrated, in FIG. 4b, the posts 300 can be constructed as a ring wall that surrounds a core 302 (e.g., an oxide core). The core 302 can contain one or more materials or can be hollow. Although the posts 300 are illustrated in FIGS. 4a and 4b as being circular, it should be understood that the posts 300 can have any desired shape, such as triangular, square, polygonal, etc., and any size.

Figure 4C:
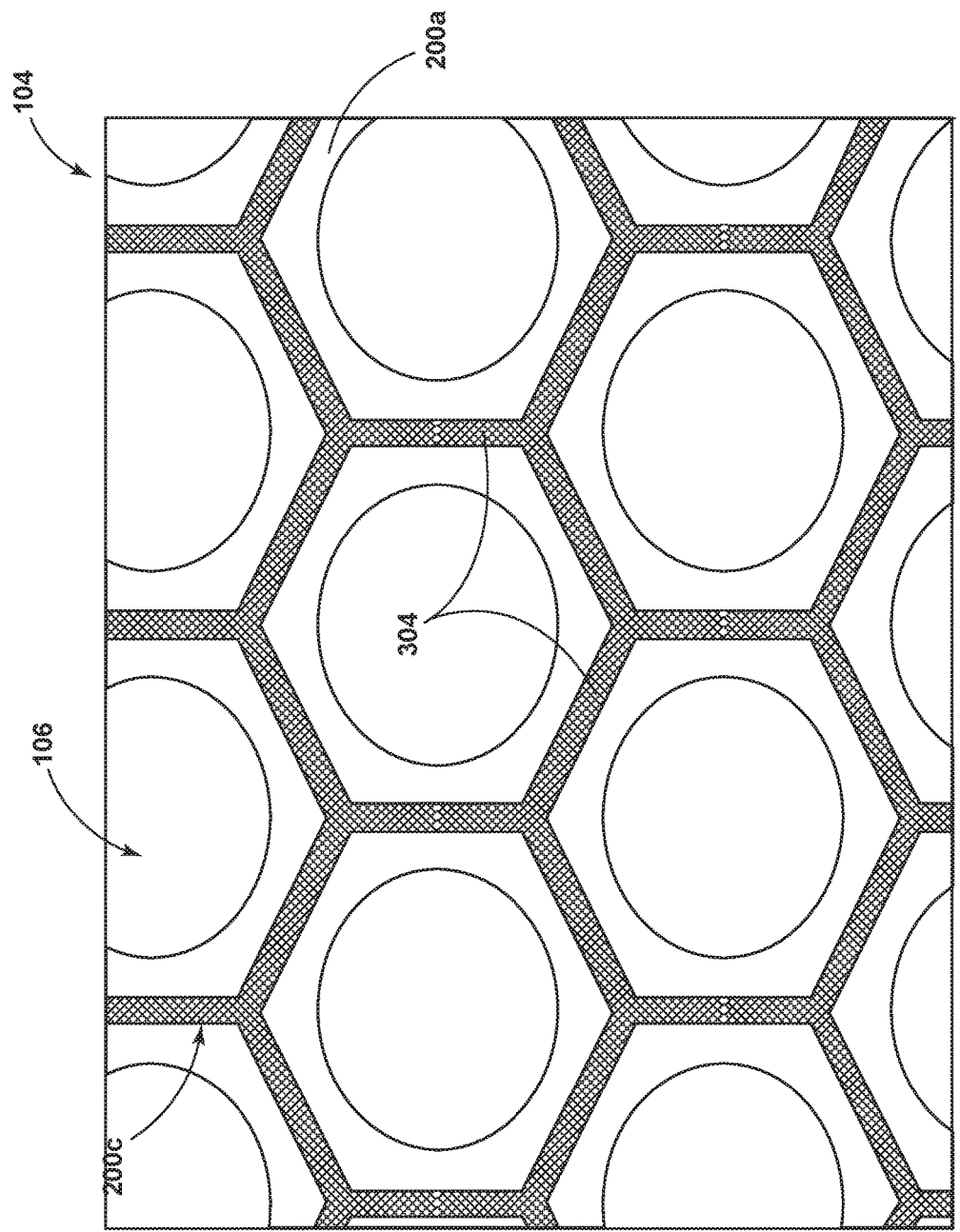
FIG. 4c is a top, plan view of a composite backplate including an interconnect layer composed of a continuous wall.

In some embodiments, rather than being constructed as discrete posts 300, the interconnect layer 200c can be constructed as walls. For example, FIG. 4c is a top, plan view of the backplate 104 where the interconnect layer 200c consists of a single continuous wall 304 between the holes 106. Although the walls 304 are illustrated in FIG. 4c as continuous straight walls, the walls 304 can be continuous or intermittent and straight or curved and can include one or more multiple walls (e.g., two parallel walls encapsulating a region between the walls that can be hollow or filled with one or more materials). FIG. 4d is a top, plan view of the backplate 104 where the interconnect layer 200c is constructed of multiple materials including one material used to form a plurality of continuous walls surrounding the backplate perimeter and each backplate opening in order to encapsulate and protect a second interconnect layer material in a region interior to the walls.

Figure 5A:
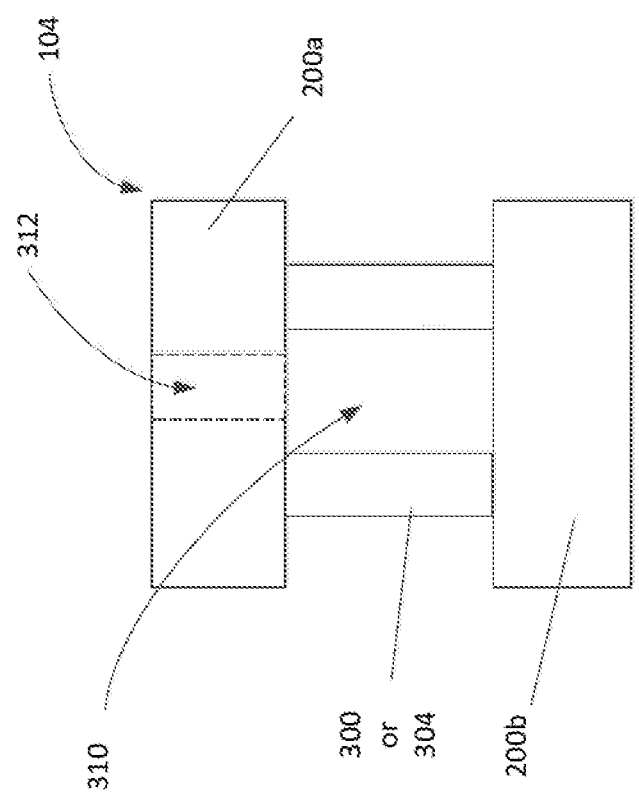
Figure 5B:
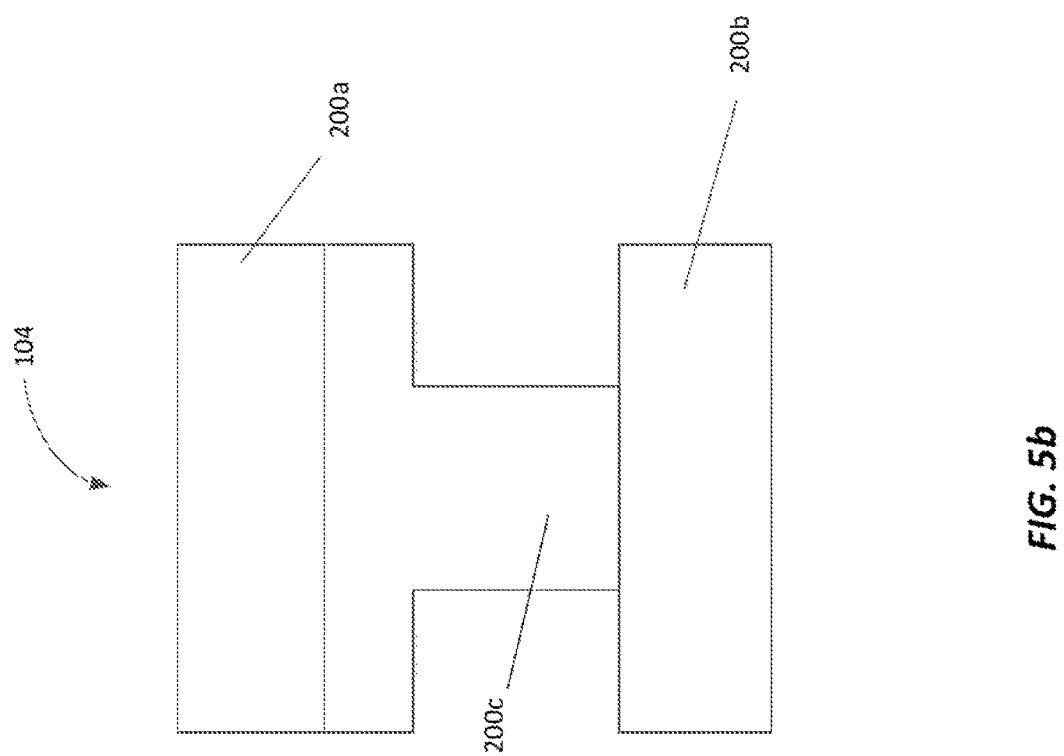

FIGS. 5a-c illustrate additional alternative constructions for the composite backplate 104. In particular, FIG. 5a illustrates a composite backplate 104 including an interconnect layer 200c having a double wall 304 (see FIG. 4c) or discrete ring posts 300 (see FIGS. 4a and 4b). The wall 304 or ring posts 300 protect a core 310 that can be filled with a different material than the interconnect layer 200c, such as silicon dioxide. In other embodiments, the core 310 can be hollow. An optional release hole 312 can be formed in the upper layer 200a. The release hole 312 allows removal of material to create a core 310 that is hollow. It should be understood that the release hole 312 can alternatively or in addition be included in the lower layer 200b.

FIG. 5b illustrates an alternative backplate 104 that includes an interconnect layer 200c formed as either walls 304 or posts) where an upper portion of layer 200c is wider or has a different shape than the lower portion. For example, in some embodiments, as illustrated in FIG. 5b, the upper portion of the layer 200c matches a shape or size of the upper layer 200a. Forming the interconnect layer 200c in this fashion stiffens and provide more support to the upper layer 200a. It should be understood that the constructions of the interconnect layer 200c illustrated in FIG. 5b can alternatively or in addition be used with the lower layer 200b.

A similar construction of the interconnect layer 200c can also be used with no upper layer 200a to form the backplate 104 (see FIG. 5c). As previously noted, forming the interconnect layer 200c as illustrated in FIG. 5c stiffens and provides support to the backplate 104 (e.g., the lower layer 200b). It should be understood that the constructions of the interconnect layer 200c illustrated in FIG. 5c can alternatively of in addition be used when the backplate 104 does not include a lower layer 200b.

Thus, embodiments of the invention provide, among other things, a composite backplate that is thin and highly perforated yet strong and flat with adequate tensile properties. The composite backplate can also provide better particle filtration with less reduction of acoustic signal-to-noise ratio than existing backplates. It should be understood that the same patterns can be used as a front plate in a MEMS system. Also, the backplate (or frontplate) of this construction can be formed using CMOS MEMS material layers or traditional MEMS material layers and processing steps.

What is claimed is:

1. A MEMS device, the device comprising:
    a membrane;
    a reinforced backplate having a plurality of openings, the reinforced backplate including a first layer and a second layer coupled to the first layer; and
    an interconnect layer positioned between the first and second layers, the interconnect layer coupling the first layer to the second layer.

2. The MEMS device of claim 1, wherein the second layer provides added strength to the reinforced backplate allowing thinner web sections between the openings and enabling the inclusion of more, smaller openings than possible without the added strength provided by the second layer.

3. The MEMS device of claim 1, wherein the first layer is constructed of a composite of thin material layers.

4. The MEMS device of claim 1, wherein the second layer is constructed of a composite of thin material layers.

5. The MEMS device of claim 1, wherein at least one of the first and second layers is constructed of a stack of titanium nitride, titanium, aluminum copper, titanium, and titanium nitride.

6. The MEMS device of claim 1, wherein at least one of the first and second layers is an electrical insulating material.

7. The MEMS device of claim 1, wherein the interconnect layer is constructed of a different material than the first and second layers.

8. The MEMS device of claim 7, wherein the interconnect layer is constructed of a CMOS via material.

9. The MEMS device of claim 1, wherein the interconnect layer has a smaller width than the first and second layers.

10. The MEMS device of claim 1, wherein the first and second layers have different widths.

11. The MEMS device of claim 1, further comprising a third layer coupled to the first or second layer via a second interconnect layer.

12. The MEMS device of claim 1, wherein the interconnect layer is made up of discrete connections.

13. The MEMS device of claim 12, wherein the discrete connections are circular posts.

14. The MEMS device of claim 13, wherein the circular posts are solid.

15. The MEMS device of claim 13, wherein the circular posts are hollow.

16. The MEMS device of claim 1, wherein the interconnect layer is a single continuous wall.

17. The MEMS device of claim 1, wherein the interconnect layer includes a plurality of continuous wall sections.

18. The MEMS device of claim 17, wherein the plurality of continuous wall sections are constructed of a first material which encapsulates other interconnect layer regions constructed of a second material.

19. The MEMS device of claim 1, wherein the interconnect layer is encapsulated by the first and second layers.

20. The MEMS device of claim 1, wherein one of the first and second layer includes a release hole.

21. The MEMS device of claim 1, wherein the interconnect layer includes a narrower first portion and a wider second portion.

22. The MEMS device of claim 21, wherein the wider second portion has the same width as the first or second layer.

* * * * *